(12) United States Patent
Kim et al.

(10) Patent No.: US 8,638,596 B2
(45) Date of Patent: Jan. 28, 2014

(54) NON-VOLATILE MEMORY SAVING CELL INFORMATION IN A NON-VOLATILE MEMORY ARRAY

(75) Inventors: Jung Pill Kim, San Diego, CA (US); Taehyun Kim, San Diego, CA (US); Hari M. Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 13/189,784

(22) Filed: Jul. 25, 2011

(65) Prior Publication Data

US 2013/0028009 A1    Jan. 31, 2013

(51) Int. Cl.
G11C 11/00    (2006.01)

(52) U.S. Cl.
USPC ....... 365/158; 365/200; 365/201; 365/230.06

(58) Field of Classification Search
USPC .............. 365/158, 200, 201, 230.06, 189.05, 365/225.7, 148
See application file for complete search history.

(56) References Cited

U.S. PATENT DOCUMENTS

| | | | | |
|---|---|---|---|---|
| 6,809,976 B2 * | 10/2004 | Ooishi | ............... | 365/158 |
| 7,257,020 B2 * | 8/2007 | Hidaka | ............... | 365/171 |
| 7,512,001 B2 * | 3/2009 | Kwon et al. | ............... | 365/185.09 |
| 8,031,544 B2 * | 10/2011 | Kim et al. | ............... | 365/200 |
| 2003/0156469 A1 | 8/2003 | Viehmann et al. | | |
| 2003/0223269 A1 | 12/2003 | Hidaka | | |
| 2005/0213401 A1 | 9/2005 | Shimizu et al. | | |
| 2007/0140033 A1 | 6/2007 | Yang et al. | | |

OTHER PUBLICATIONS

International Search Report and Written Opinion—PCT/US2012/048208—ISA/EPO—Dec. 7, 2012.

* cited by examiner

*Primary Examiner* — David Lam
(74) *Attorney, Agent, or Firm* — Sam Talpalatsky; Nicholas J. Pauley; Joseph Agusta

(57) ABSTRACT

Systems and methods for saving repair cell address information in a non-volatile magnetoresistive random access memory (MRAM) having an array of MRAM cells are disclosed. A memory access circuit is coupled to the MRAM, and is configured to store failed cell address information in the MRAM.

21 Claims, 8 Drawing Sheets

PARALLEL MAGNETIZATION
LOW RESISTANCE
STATE "0"

ANTIPARALLEL MAGNETIZATION
HIGH RESISTANCE
STATE "1"

NON-VOLATILE MEMORY SAVING CELL INFORMATION IN A NON-VOLATILE MEMORY ARRAY

FIELD OF DISCLOSURE

This disclosure relates generally to electronics, and more specifically, but not exclusively, to apparatus and methods for accessing a non-volatile memory.

BACKGROUND

Random access memory (RAM) is a ubiquitous component of modern digital architectures, RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM.

Magnetoresistive Random Access Memory (MRAM) is a non-volatile memory technology having response (read/write) times comparable to volatile memory. In contrast to conventional RAM technologies, which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can have a magnetic field, separated by an insulating (tunnel barrier) layer 120. One of the two layers (e.g., fixed layer 110), is pinned to a particular polarity. The other layer's (e.g., free layer 130) polarity 132 is free to change to match that of an external applied field. A change in the polarity 132 of the free layer 130 changes the resistance of the MTJ storage element 100. For example, when the polarities are aligned, as depicted in FIG. 1A, a low resistance state exists. When the polarities are not aligned, as depicted in FIG. 1B, then a high resistance state exists. The illustration of MTJ 100 is simplified, and each layer illustrated can comprise one or more layers of materials.

Referring to FIG. 2A, a memory cell 200 of a conventional MRAM is depicted during a read operation. The cell 200 includes a transistor 210, a bit line 220, a digit line 230 and a word line 240. The cell 200 is read by measuring the electrical resistance of the MTJ 100. For example, a particular MTJ 100 can be selected by activating an associated transistor 210, which can switch current from a bit line 220 through the MTJ 100. Due to a tunnel magnetoresistive effect, the electrical resistance of the MTJ 100 changes based on the orientation of the polarities in the two magnetic layers (e.g., 110, 130), as discussed above. A resistance inside any particular MTJ 100 can be determined from a current intensity determined by the polarity of the free layer. If the fixed layer 110 and free layer 130 have the same polarity, the resistance is low and a logic "0" is read. If the fixed layer 110 and free layer 130 have an opposing polarity, the resistance is higher and a logic "1" is read.

Referring to FIG. 2B, the memory cell 200 of a conventional MRAM is depicted during a write operation, which is a magnetic operation. Transistor 210 is off during the write operation. Current propagates through the bit line 220 and the digit line 230 to establish magnetic fields 250 and 260, which affect the polarity of the free layer of the MTJ 100, and consequently the logic state of the cell 200. Accordingly, data can be written to, and stored in, the MTJ 100.

MRAM has several desirable characteristics that make it a candidate for a universal memory, such as high speed, high density (i.e., small bitcell size), low power consumption, and no degradation over time.

A variation of MRAM is Spin Transfer Torque Magnetoresistive Random Access Memory (STT-MRAM). STT-MRAM uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During a write operation, the spin-polarized electrons exert torque on a free layer, which switches a polarity of the free layer. During a read operation, a current detects the resistance/logic state of the MTJ storage element, as discussed in the foregoing description. As illustrated in FIG. 3A, a STT-MRAM bit cell 300 includes a MTJ 305, a transistor 310, a bit line 320, and a word line 330. The transistor 310 is switched on for both read and write operations to allow current to flow through the MTJ 305, so the logic state can be read or written.

Referring to FIG. 3B, a more detailed diagram of a STT-MRAM cell 301 is illustrated, for further discussion of the read/write operations. In addition to the previously discussed elements such as the MTJ 305, the transistor 310, the bit line 320 and the word line 330, a source line 340, a sense amplifier 350, read/write circuitry 360, and a bit line reference 370 are illustrated. As discussed above, the write operation in an STT-MRAM is electrical. The read/write circuitry 360 generates a write voltage between the bit line 320 and the source line 340. Depending on the polarity of the voltage between the bit line 320 and the source line 340, the polarity of the free layer of the MTJ 305 can be changed, and correspondingly, the logic state can be written to the cell 301. Likewise, during a read operation, a read current is generated, which flows between the bit line 320 and the source line 340 through the MTJ 305. When the current is permitted to flow via the transistor 310, the resistance (logic state) of the MTJ 305 is determined, based on the voltage differential between the bit line 320 and the source line 340, which is compared to a reference 370, and then amplified by the sense amplifier 350. Additional details are provided, for example, in U.S. Pat. No. 7,764,537, which is incorporated herein by reference in its entirety.

Accordingly, a non-volatile MRAM memory can be fabricated as an array of the memory cells 200. A gate of the transistor 210 is coupled to a word line (WL). During write operations, a supply voltage is applied to the bit line 220 or the digit line 230. During read operations, a read voltage is applied to the bit line 220, and the digit line 230 is set to ground. The WL is coupled to a supply voltage during both read and write operations.

Despite the characteristics described above, the memory cell 200 is not a perfect device. Sometimes, during either fabrication or use, the memory cells 200 in an MRAM memory can fail, which renders a non-volatile MRAM memory address having the failed memory cell 200 useless. In a conventional MRAM circuit, a programmable read-only memory (PROM) stores the failed address in an antifuse array, to prevent the failed memory cell 200 from storing data.

There are long-felt industry needs for apparatus and methods to reduce a size of a device storing the failed memory cell's addresses. Reducing the size of the failed address storage device will improve performance, and reduce size, of a device into which the MRAM is integrated. There are also long-felt industry needs for apparatus and methods to reduce the number of interconnects used to access the device storing the failed memory cell's addresses, as well as to increase the number of stored repair cell addresses.

SUMMARY

Exemplary embodiments of the invention are directed to systems and methods for accessing a non-volatile memory.

In an example, a magnetoresistive random access memory (MRAM) circuit has an array of MRAM cells. A memory access circuit is coupled to the array, and is configured to store cell address information in the array of MRAM cells. The array has three portions. The first portion is configured to store cell addresses. The second portion is configured to backup the third portion, which is used for data storage. For example, the second portion backs up the third portion if a cell in the third portion fails. A latch circuit is coupled to the first portion of the array, and a comparing circuit, having an address input port, is coupled to the latch circuit. The comparing circuit is configured to substitute a repair cell address for an address received from the address input port.

The memory access circuit can have a row address decoder coupled to the comparing circuit and the second portion, and configured to access the repair cell address in the second portion. In an example, at least a part of the MRAM circuit is integrated in a semiconductor die. The MRAM circuit can also be integrated into a device, such as a set top box, music player, video player, entertainment unit, navigation device, communications device, personal digital assistant (PDA), fixed location data unit, or a computer.

In a further example, a method of mitigating a failed cell in an MRAM is provided. The method includes determining an address of the failed cell, and writing the failed cell address and a corresponding repair cell address to the MRAM. Data addressed to the failed cell address is received, and the data is written to the MRAM at the repair cell address. Means for executing the steps of this method are also provided.

In another example, provided is a method of retrieving data from an MRAM. The method includes retrieving a failed cell address from the MRAM, receiving a read address, and determining if the read address matches the failed, cell address. If the read address does not match the failed cell address, data located at the read address in the MRAM is read. If the read address matches the failed cell address, data located at a repair cell address in the MRAM is read. This method can include transferring the failed cell address from the MRAM to the latch circuit, as well as transferring the repair cell address from the comparing circuit to a row address decoder.

The foregoing has broadly outlined the features and technical advantages of the present teachings in order that the detailed description that follows may be better understood. Additional features and advantages are described herein, which form the subject of the claims. The conception and specific embodiments disclosed can be readily utilized as a basis for modifying or designing other structures for carrying out the same purposes of the present teachings. Such equivalent constructions do not depart from the technology of the teachings as set forth in the appended claims. The novel features which are believed to be characteristic, of the teachings, both as to its organization and method of operation, together with further objects and advantages are better understood from the following description when considered in connection with the accompanying figures. Each of the figures is provided for the purpose of illustration and description only, and do not define limits of the present teachings.

BRIEF DESCRIPTION OF THE DRAWINGS

The accompanying drawings are presented to describe examples of the present teachings, and are not provided as limitations.

In accordance with common practice, some of the drawings are simplified for clarity. Thus, the drawings may not depict all components of a given apparatus (e.g., device) or method. Finally, like reference numerals are used to denote like features throughout the specification and figures.

DETAILED DESCRIPTION

Figure 1A:
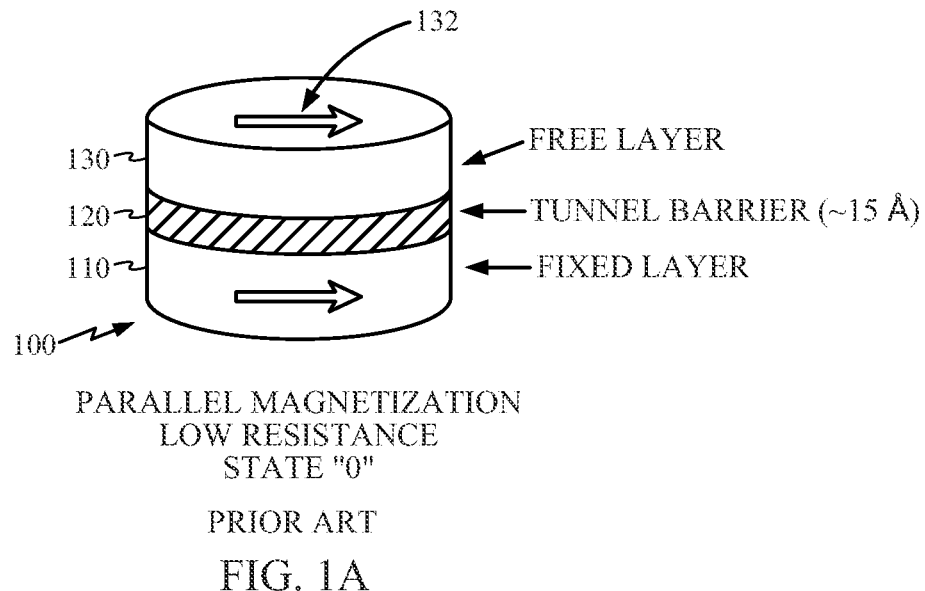
FIGS. 1A and 1B depict a magnetic tunnel junction (MTJ) storage element.
Figure 1B:
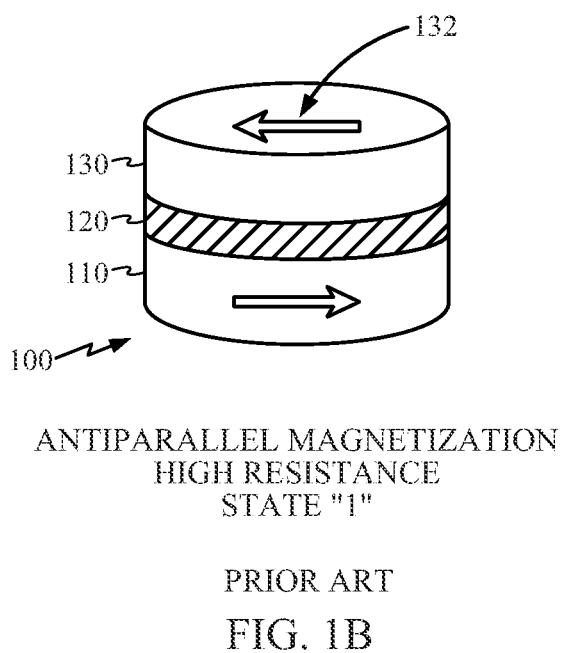
Figure 2A:
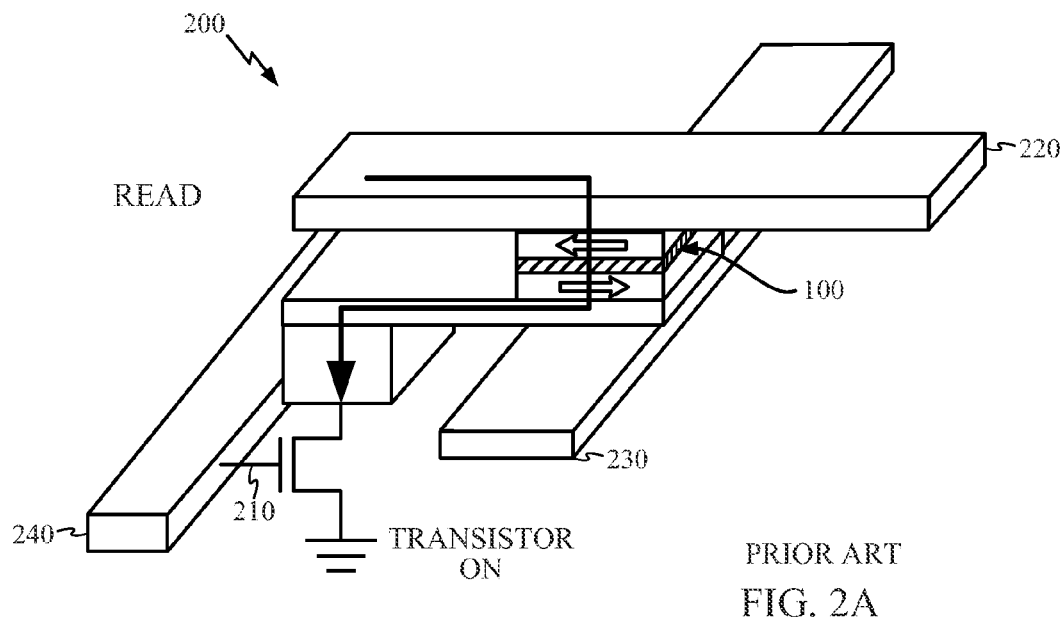
FIGS. 2A and 2B depict a Magnetoresistive Random Access Memory (MRAM) cell during read and write operations, respectively.
Figure 2B:
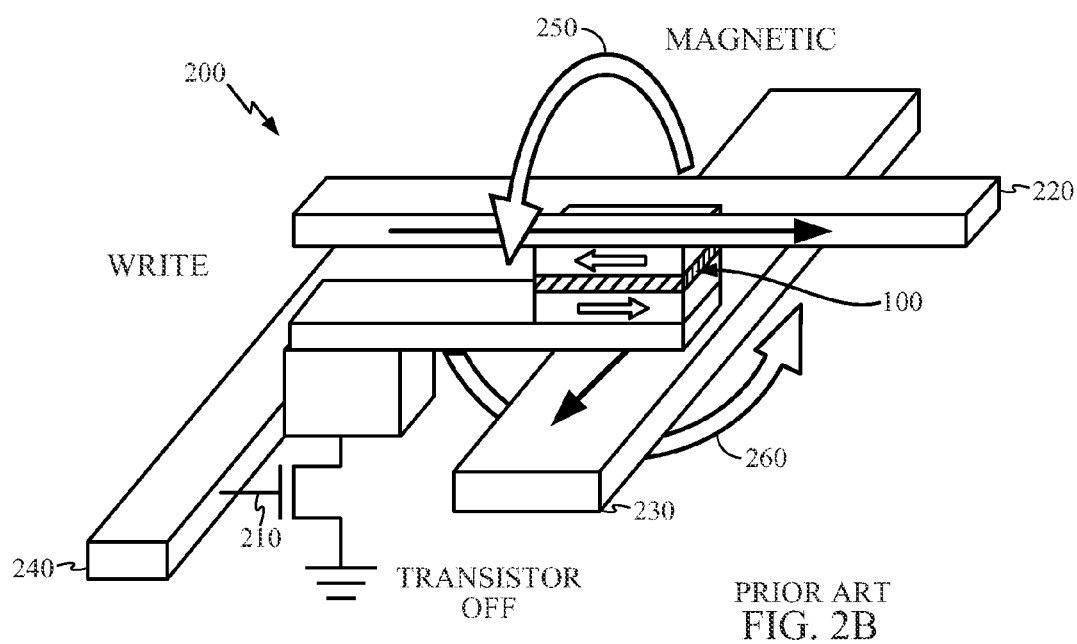
Figure 3A:
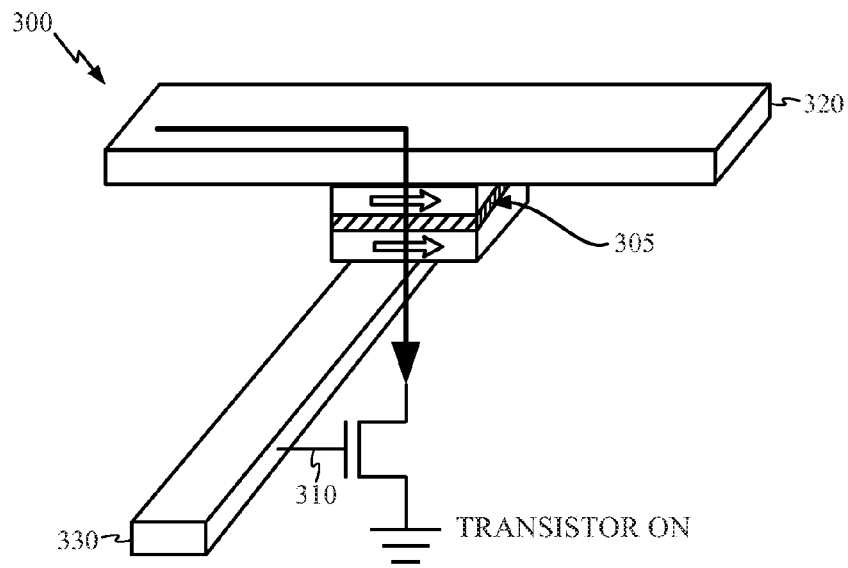
FIGS. 3A and 3B depict Spin Transfer Torque Magnetoresistive Random Access Memory (STT-MRAM) cells.
Figure 3B:
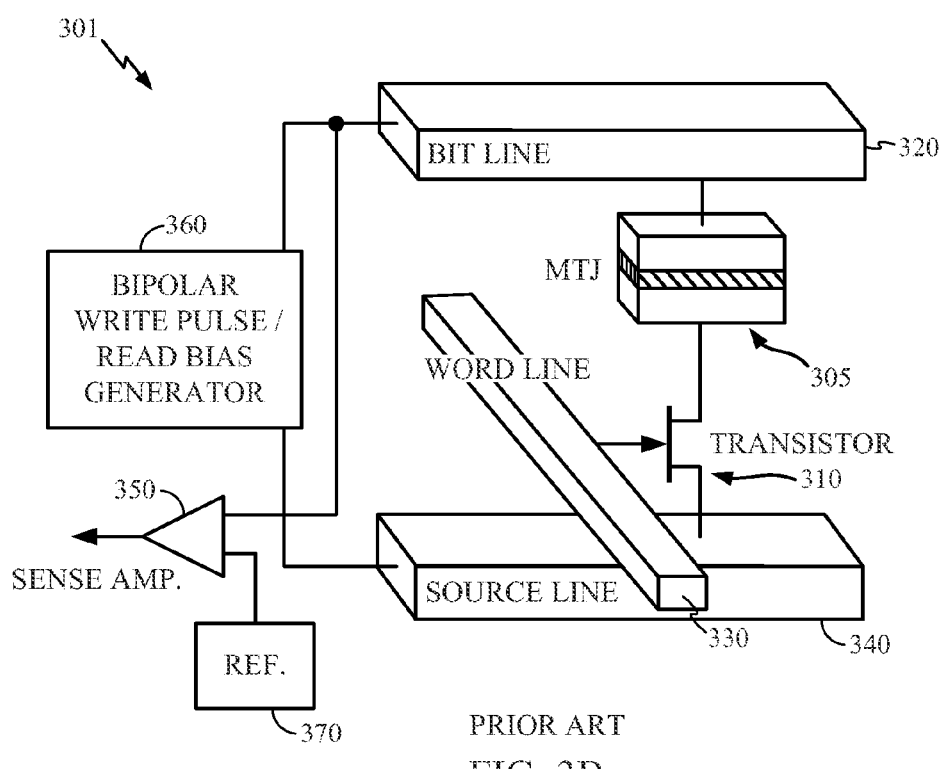

Aspects of the invention are disclosed in the following description and related drawings directed to specific embodiments of the invention. Alternate embodiments may be devised without departing from the scope of the invention. Additionally, well-known elements of the invention will not be described, in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

It should be understood that the term "signal" can include any signal such as a data signal, audio signal, video signal, multimedia signal.

Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed, there or that the first element must precede the second element in some manner. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described, herein, the corresponding form of any such embodiments may be described herein as, for example, "logic configured to" perform the described action.

INTRODUCTION

Systems and methods for accessing a non-volatile memory are provided. In an example, the effects of a cell failure in a magnetoresistive random access memory (MRAM) are mitigated by readdressing read and write operations from the failed cell to a repair cell. Information about failed cells and respective repair cells are stored in the MRAM, and are used for readdressing read and write commands.

EXPLANATION OF THE FIGURES

Figure 4:
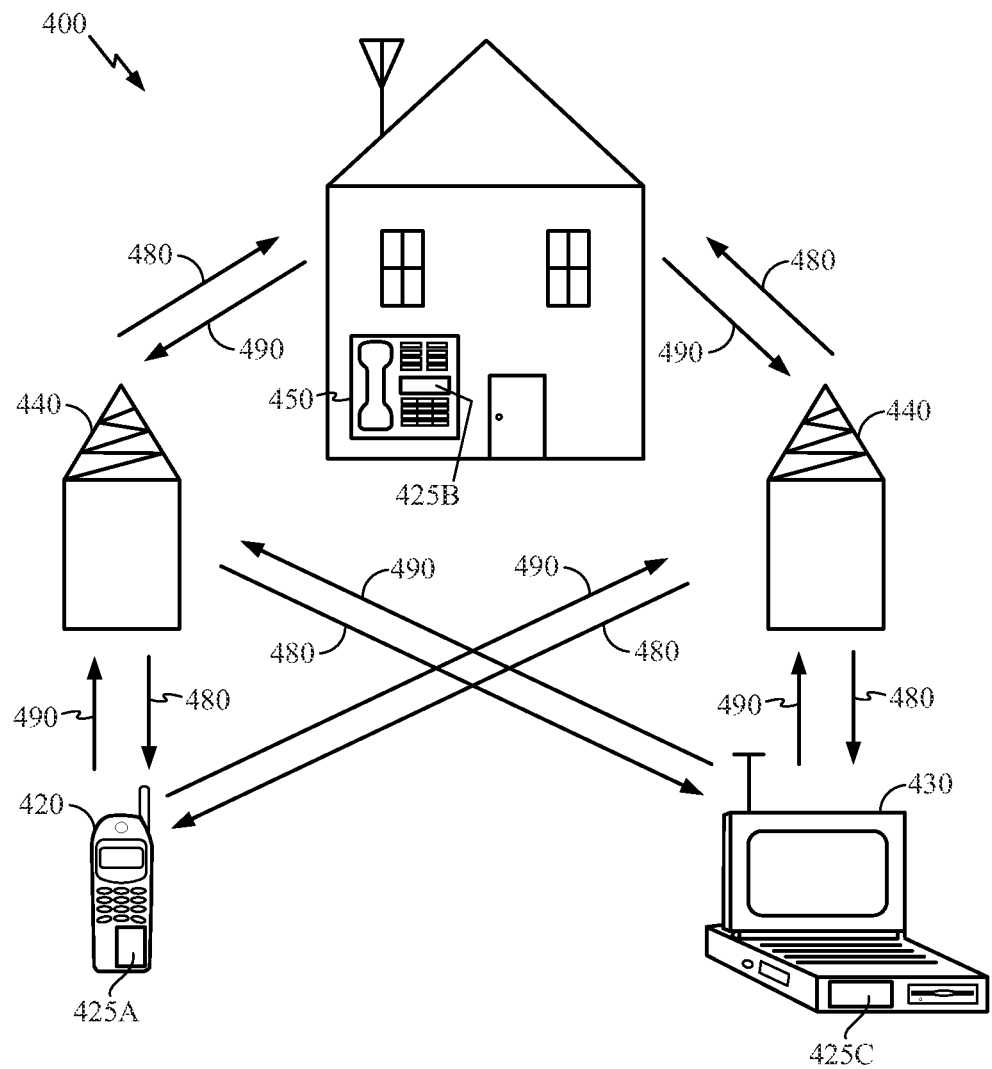
FIG. 4 depicts an exemplary communication system.

FIG. 4 depicts an exemplary communication system 400 in which an embodiment of the disclosure can be advantageously employed. For purposes of illustration, FIG. 4 shows three remote units 420, 430, and 450 and two base stations 440. It will be recognized that conventional wireless communication systems can have many more remote units and base stations. The remote units 420, 430, and 450 include at least a part of an embodiment 425A-C of the disclosure as discussed further herein. FIG. 4 shows forward link signals 480 from the base stations 440 and the remote units 420, 430, and 450, as well as reverse link signals 490 from the remote units 420, 430, and 450 to the base stations 440.

In FIG. 4, remote unit 420 is shown as a mobile telephone, remote unit 430 is shown as a portable computer, and remote unit 450 is shown as a fixed location remote unit in a wireless local loop system. For example, the remote units can be mobile phones, hand-held, personal communication systems (PCS) units, portable data units such as personal data assistants, GPS enabled devices, navigation devices, set-top boxes, music players, video players, entertainment units, fixed location data units such as meter reading equipment, receivers, or any other device that stores or retrieves data or computer instructions, or any combination thereof. Although FIG. 4 illustrates remote units according to the teachings of the disclosure, the disclosure is not limited to these exemplary illustrated units. Embodiments of the disclosure can be suitably employed in any device which includes active integrated circuitry including memory and on-chip circuitry for test and characterization.

Figure 5:
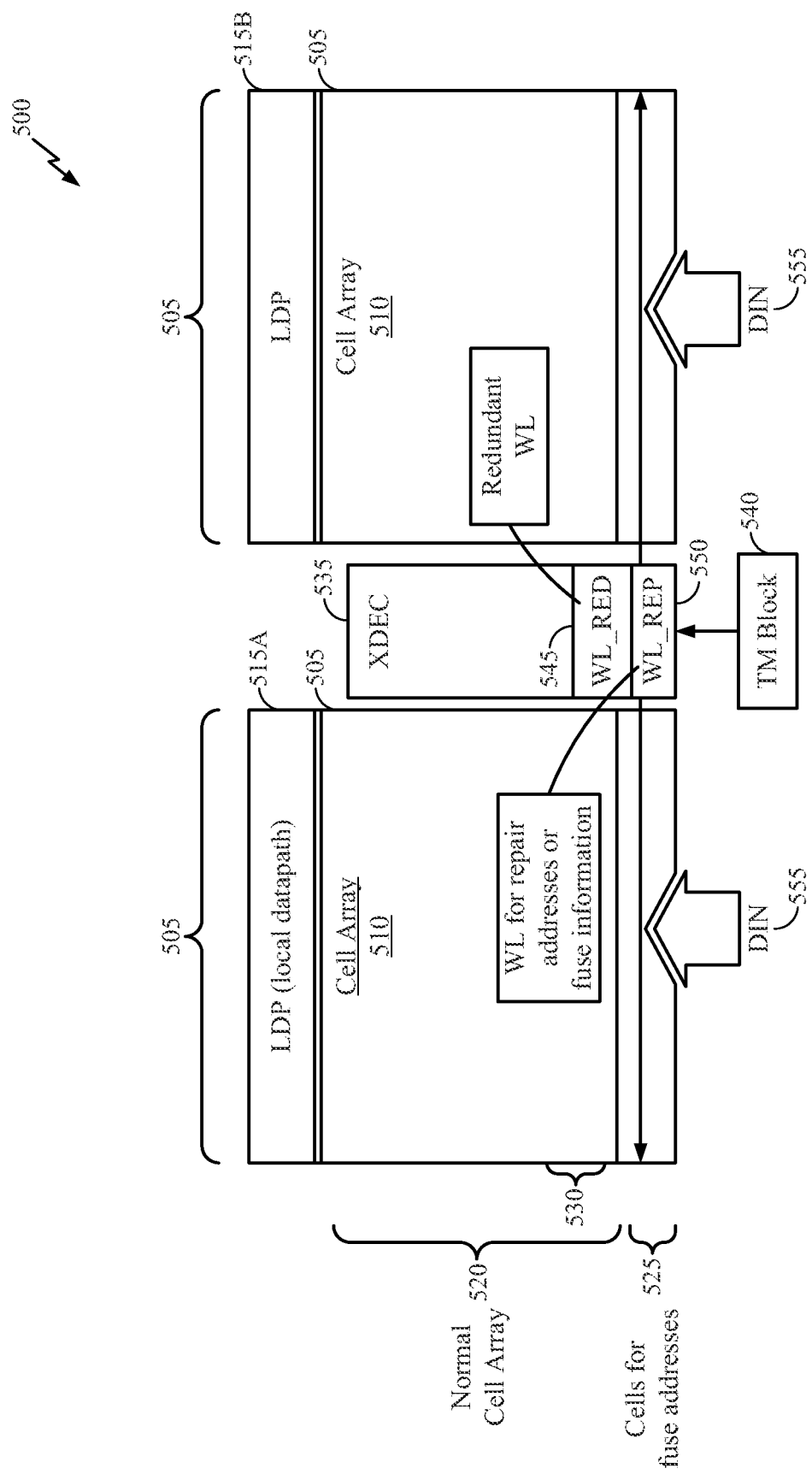
FIG. 5 depicts an exemplary MRAM circuit during an exemplary repair address write cycle.

FIG. 5 depicts an exemplary MRAM circuit 500 during an exemplary repair address write cycle. The MRAM circuit 500 has an MRAM 505. The MRAM 505 includes an array of MRAM memory cells 510, such as the memory cells described in FIGS. 1A-B, 2A-B, and 3A-B. The MRAM 505 can be partitioned, for example, into a first local datapath (LDP) 515A and a second local datapath 515B. Each LDP 515A-B has a first portion that is a cell array 520, which provides non-volatile storage of user data. The MRAM 505 also has another portion of cells 525 for storing failed cell addresses. Storing the failed cell addresses and in the MRAM 505, instead of in a programmable read-only memory (PROM) antifuse or fuse array, saves valuable space in an integrated circuit. Repair cells are located in a redundant cell section 530 of the MRAM 505. In an example, at least a part of the MRAM circuit 500 is integrated in a semiconductor die.

To interface the MRAM 505, the MRAM 505 is coupled to memory access circuitry, such as a row-address decoder (XDEC) 535, a test mode (TM) block 540. The row-address decoder (XDEC) 535 enables data transfer from a row identified by an address. The XDEC 535 includes a redundant word line latch (WL_RED) circuit 545, which enables redundant cells in a row identified by a repair cell address. The XDEC 535 includes a word line repair (WL_REP) circuit 550, which enables cells storing failed cell addresses and test bit information. The test mode (TM) block 540 provides instructions to the XDEC 535 during a repair address write cycle and the repair address transfer cycle, which is described in further detail herein.

During the repair address write cycle, an address of the failed cell is determined. For example, failed cells in the MRAM 505 are captured by typical memory test flow. After a failed cell is identified, the WL_REP 550 enables a row of the cells 525, and the address of the failed cell is written to the enabled cells 525 via a data in (DIN) input 555. In addition, chip and/or test bit information can also stored into cells 525 together with the addresses of failed cells.

Figure 6:
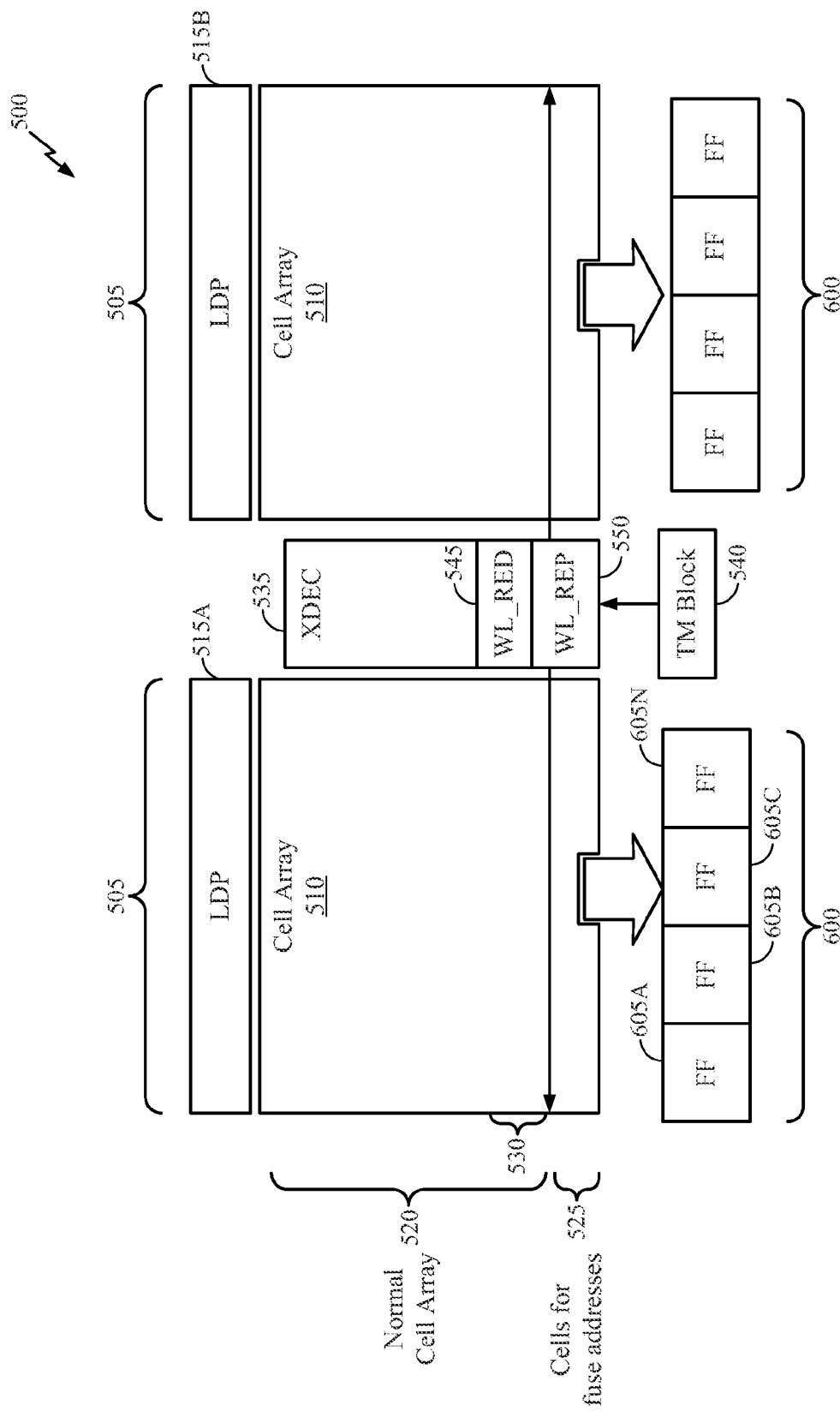
FIG. 6 depicts an exemplary MRAM circuit during an exemplary repair address transfer cycle.

FIG. 6 depicts the MRAM circuit 500 during an exemplary repair address transfer cycle. The repair address transfer cycle occurs, for example, during boot-up of the device in which the MRAM circuit 500 is integrated. Based on instructions from the TM block 540, the WL_REP 550 enables a row of the cells 525 to retrieve the failed cell address(es) from the MRAM 505. The failed cell address(es) are transferred from the cells 525 to a latch circuit 600 for future use. The latch circuit 600 can be a group of flip-flop circuits 605A-N. A copy of the failed cell address(es) remains in the cell addresses cells 525.

Figure 7:
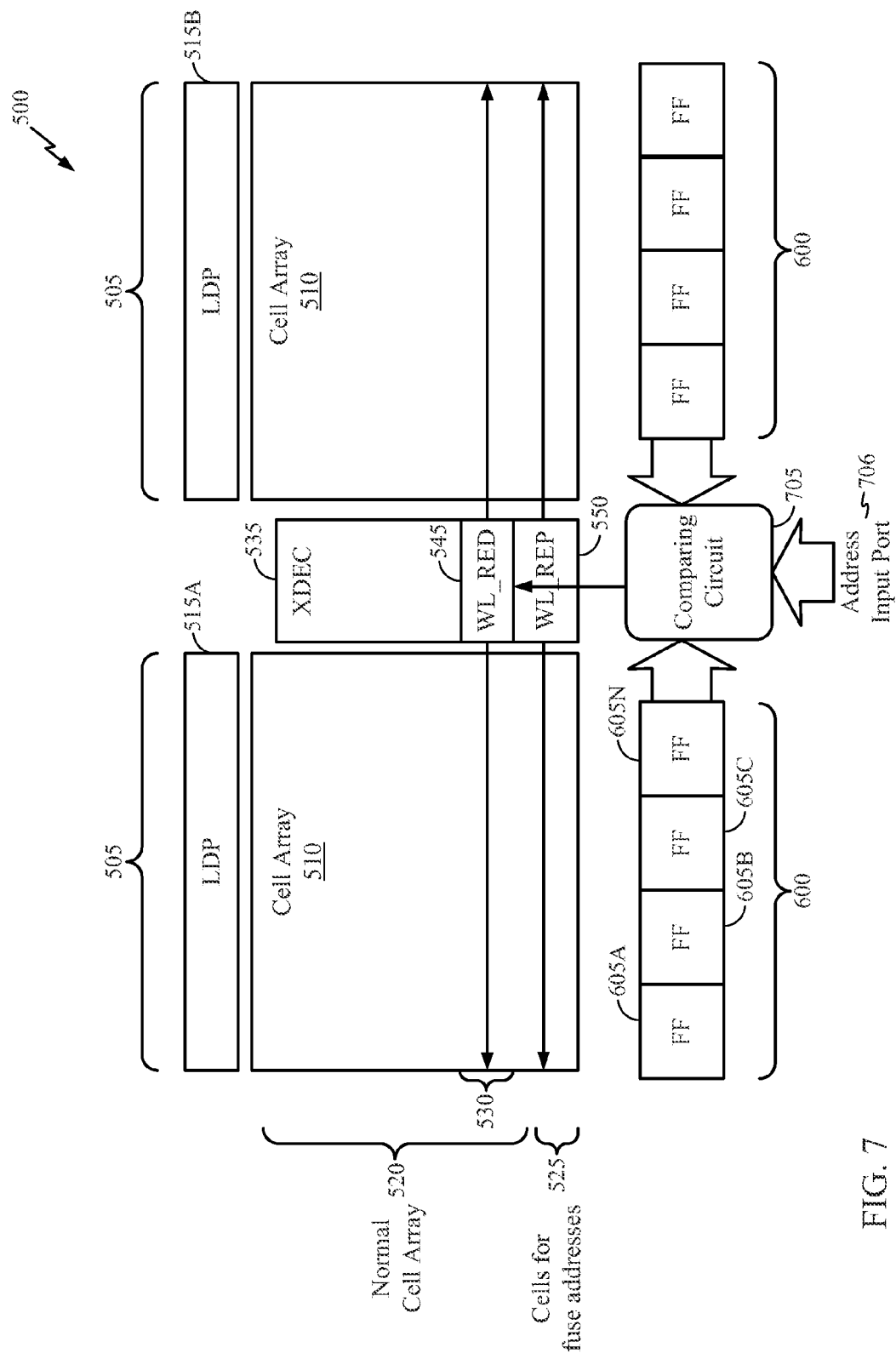
FIG. 7 depicts an exemplary MRAM circuit during write and read cycles.

FIG. 7 depicts the MRAM circuit 500 during normal write and read cycles. During the write cycle, incoming data, having a write address, to be written to the MRAM 505 is received via an address input port 700. A comparator circuit 705 compares the write address with at least one failed cell address in the latch circuit 600 to determine if the write address is an address of a failed cell. If the write address is an address of the failed cell, then the received data is written to the redundant cells 530 instead of the cells at the write address. If the write address is not an address of a failed cell, then the incoming data is instead written to the MRAM 505 at the write address.

During a read cycle, a request to read data, having a read address, is received via the address input port 700. The read address is compared to at least one failed cell address in the latch circuit 600, to determine if the read address matches any failed cell address. If the read address matches a failed cell address, then data stored in the MRAM 505 is read from the redundant cells. If the read address does not match any failed cell address, then the requested data is read from the MRAM 505 at the read address. The data to be read is retrieved by sending, to the XDEC 535, either the read address or the repair cell address, depending on the comparison results.

Figure 8:
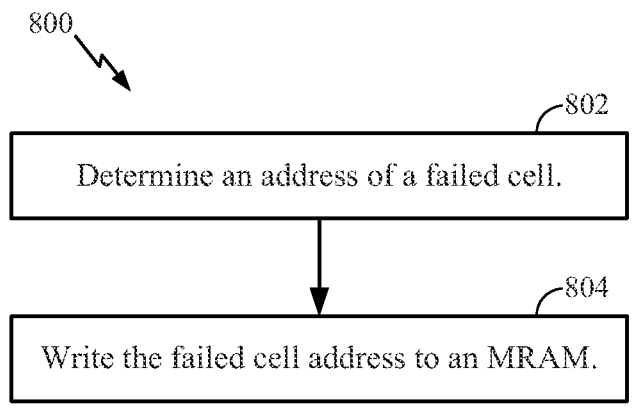
FIG. 8 is a flowchart of an exemplary method of storing failed address information and/or chip/test bit information in the cells.
Figure 9:
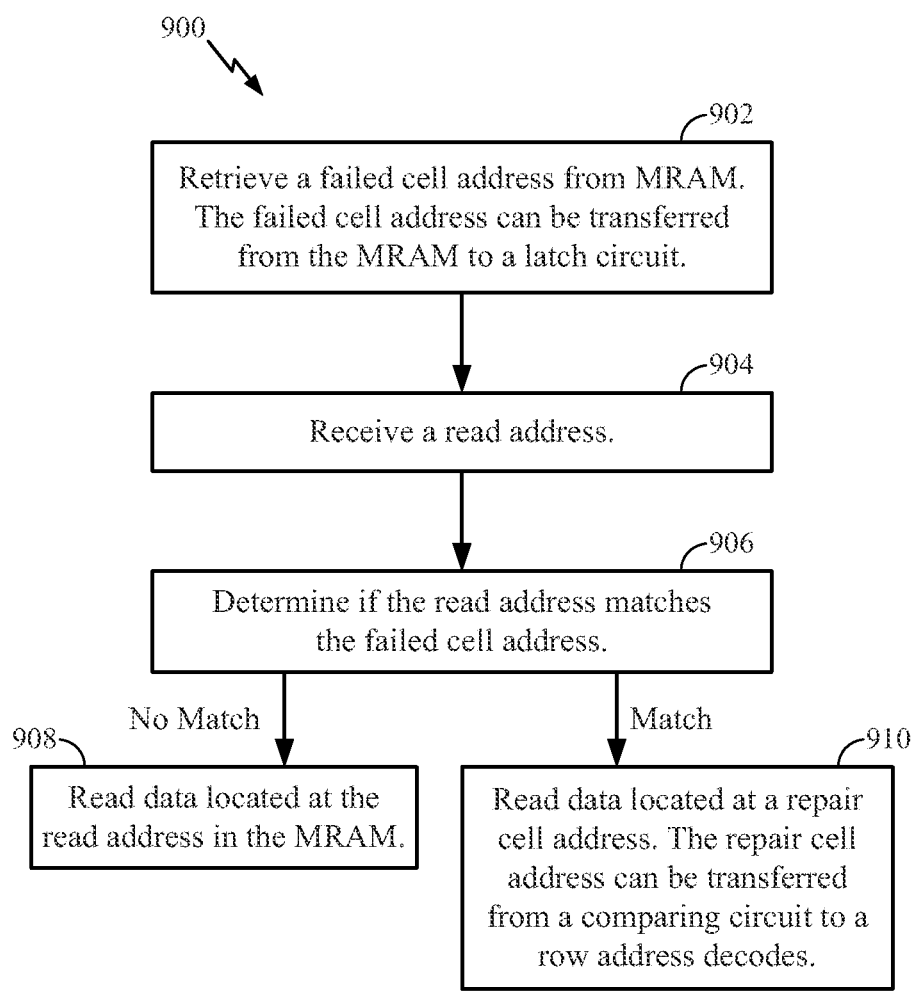
FIG. 9 is a flowchart of an exemplary method of retrieving data from a MRAM.

FIGS. 8 and 9 describe methods for accessing an MRAM having a failed cell. The methods disclosed comprise one or more steps or actions for achieving the described method. The method steps and/or actions can be interchanged with one another without departing from the scope of the claims. In other words, unless a specific order of steps or actions is specified, the order and/or use of specific steps and/or actions can be modified without departing from the scope of the claims.

FIG. 8 is a flowchart of a method 800 of storing failed cell address information and/or chip/test bit information in the cells 525. The method can be executed, for example, by the MRAM circuit 500.

In step 802, an address of the failed cell is determined.

In step 804, the failed cell address is written to the MRAM.

FIG. 9 is a flowchart of a method 900 of retrieving data from a MRAM using a repair address transfer cycle and a read cycle. The method can be executed, for example, by the MRAM circuit 500.

In step 902, a failed cell address is retrieved from the MRAM. The retrieving can include transferring the failed cell address from the MRAM to a latch circuit.

In step 904, a read address is received.

In step 906, it is determined if the read address matches the filled cell address.

In step 908, if the read address does not match the failed cell address, data located at the read address in the MRAM is read.

In step 910, if the read address matches the failed cell address, data located at a repair cell address in the MRAM is read. The data reading can include transferring the repair cell address from the comparing circuit to a row address decoder.

CONCLUSION

Those of skill in the art will appreciate that information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present teachings.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems, LTE is a release of UMTS that uses E-UTRA. UTRA, E-UTRA, GSM, UMTS and LTE are described in documents from an organization named "3rd Generation Partnership Project"

(3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Rel99, Rel5, Rel6, Rel7) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

The methods, sequences and/or algorithms described, in connection with the embodiments disclosed herein can be embodied directly in hardware, in a software module executed by a processor, or in a combination of the two. A software module can reside in RAM memory, flash memory. ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium can be integral to the processor.

Accordingly, an embodiment of the invention can include a computer readable media embodying a method described herein. Accordingly, the invention is not limited to illustrated examples and any means for performing the functionality described herein are included in embodiments of the invention.

The disclosed devices and methods can be designed and can be configured into GDSII and GERBER computer files, stored on a computer readable media. These files are in turn provided to fabrication handlers who fabricate devices, based on these files, with a lithographic device. The resulting products are semiconductor wafers that are then cut into semiconductor die and packaged into a semiconductor chip. The chips are then employed in devices described herein.

Nothing that has been stated or illustrated is intended to cause a dedication of any component, step, feature, object, benefit, advantage, or equivalent to the public, regardless of whether it is recited in the claims.

While this disclosure shows exemplary embodiments of the invention, it should be noted that various changes and modifications could be made herein without departing from the scope of the invention as defined by the appended claims. The functions, steps and/or actions of the method claims in accordance with the embodiments of the invention described herein need not be performed, in any particular order. Furthermore, although elements of the invention may be described or claimed in the singular, the plural is contemplated, unless limitation to the singular is explicitly stated.

What is claimed is:

1. A magnetoresistive random access memory (MRAM) circuit, comprising:
   an array of MRAM cells including a normal portion having a redundant cell portion and
   a memory access circuit coupled to the array, and configured to store cell address information in the array.

2. The MRAM circuit of claim 1, wherein the array has a first, a second, and a third portion,
   wherein the first portion of the array is configured to store a cell address, and
   wherein the second portion is configured to backup the third portion, if the third portion fails.

3. The MRAM circuit of claim 2, wherein the memory access circuit further comprises:
   a latch circuit coupled to the first portion of the array; and
   a comparing circuit, having an address input port and coupled to the latch circuit.

4. The MRAM circuit of claim 3, wherein the memory access circuit further comprises a row address decoder coupled to the comparing circuit and the second portion, and configured to access a substitute cell address in the second portion.

5. The MRAM circuit of claim 3, wherein the memory access circuit further comprises a row address decoder coupled to the first portion.

6. The MRAM circuit of claim 1, wherein at least a part of the MRAM circuit is integrated in a semiconductor die.

7. The MRAM circuit of claim 1, further comprising a device, selected from the group consisting of a set top box, music player, video player, entertainment unit, navigation device, communications device, personal digital assistant (PDA), fixed location data unit, and a computer, into which the MRAM circuit is integrated.

8. A method of storing failed cell address information in a magnetoresistive random access memory (MRAM) including a normal portion having a redundant cell portion, comprising:
   determining the address of the failed cell, wherein the failed cell is in the normal portion; and
   writing the failed cell address and a corresponding repair cell address of a repair cell in the redundant cell portion to the MRAM.

9. A method of retrieving data from a magnetoresistive random access memory (MRAM) including a normal portion having a redundant cell portion, comprising:
   retrieving a failed cell address from the MRAM, wherein the failed cell address identifies a failed cell in the normal portion;
   receiving a read address;
   determining if the read address matches the failed cell address;
   reading data located at the read address in the MRAM, if the read address does not match the failed cell address; and
   reading data located at a repair cell address in the redundant cell portion of the MRAM, if the read address matches the failed cell address.

10. The method of claim 9, wherein the retrieving comprises transferring the failed cell address from the MRAM to a latch circuit.

11. The method of claim 9, wherein the reading data located at the repair cell address comprises transferring the repair cell address from the comparing circuit to a row address decoder.

12. A magnetoresistive random access memory (MRAM) circuit configured to store failed cell address information in the MRAM, comprising:
   means for determining the address of the failed cell, wherein the MRAM includes a normal portion having a redundant cell portion, and the failed cell address identifies a failed cell in the normal portion; and
   means for writing the failed cell address and a corresponding repair cell address of a repair cell in the redundant cell portion to the MRAM.

13. The MRAM circuit of claim 12, wherein at least a part of the MRAM circuit is integrated in a semiconductor die.

14. The MRAM circuit of claim 12, further comprising a device, selected from the group consisting of a set top box, music player, video player, entertainment unit, navigation device, communications device, personal digital assistant (PDA), fixed location data unit, and a computer, into which the MRAM circuit is integrated.

15. A magnetoresistive random access memory (MRAM) circuit configured to retrieve data from an MRAM, comprising:
- means for retrieving a failed cell address from the MRAM, wherein the MRAM includes a normal portion having a redundant cell portion, and the failed cell address identifies a failed cell in the normal portion;
- means for receiving a read address;
- means for determining if the read address matches the failed cell address;
- means for reading data located at the read address in the MRAM, if the read address does not match the failed cell address; and
- means for reading data located at a repair cell address of a repair cell in the redundant cell portion of the MRAM, if the read address matches the failed cell address.

16. The MRAM circuit of claim 15, wherein the means for retrieving comprises means for transferring the failed cell address from the MRAM to a latch circuit.

17. The MRAM circuit of claim 15, wherein the means for reading data located at the repair cell address comprises means for transferring the repair cell address from the comparing circuit to a row address decoder.

18. The MRAM circuit of claim 15, further comprising means for storing the repair cell address in the MRAM.

19. The MRAM circuit of claim 15, wherein at least a part of the MRAM circuit is integrated in a semiconductor die.

20. The MRAM circuit of claim 15, further comprising a device, selected from the group consisting of a set top box, music player, video player, entertainment unit, navigation device, communications device, personal digital assistant (PDA), fixed location data unit, and a computer, into which the MRAM circuit is integrated.

21. A non-transitory computer-readable medium, comprising instructions stored thereon that, if executed by a lithographic device, cause the lithographic device to fabricate at least a part of an integrated circuit, comprising:
- an array of MRAM cells including a normal portion having a redundant cell portion; and
- a memory access circuit coupled to the array, and configured to store cell address information in the array.

* * * * *